United States Patent
North

(10) Patent No.: US 9,742,390 B2
(45) Date of Patent: Aug. 22, 2017

(54) DC-DC CONVERTER WITH IMPROVED DISCONTINUOUS CONDUCTION MODE EFFICIENCY

(71) Applicant: KINETIC TECHNOLOGIES, INC., Sunnyvale, CA (US)

(72) Inventor: Brian North, Los Gatos, CA (US)

(73) Assignee: KINETIC TECHNOLOGIES, INC., Sunnyvale, CA (US)

( * ) Notice: Subject to any disclaimer, the term of this patent is extended or adjusted under 35 U.S.C. 154(b) by 15 days.

(21) Appl. No.: 14/738,413

(22) Filed: Jun. 12, 2015

(65) Prior Publication Data

US 2015/0364998 A1  Dec. 17, 2015

Related U.S. Application Data

(60) Provisional application No. 62/011,401, filed on Jun. 12, 2014.

(51) Int. Cl.
| | | |
|---|---|---|
| H02M 3/158 | (2006.01) | |
| H03K 17/13 | (2006.01) | |
| H02M 1/08 | (2006.01) | |
| H02M 3/157 | (2006.01) | |
| H02M 1/00 | (2006.01) | |
| H02M 1/34 | (2007.01) | |

(52) U.S. Cl.
CPC ........ H03K 17/133 (2013.01); H02M 3/1588 (2013.01); *H02M 1/08* (2013.01); *H02M 3/157* (2013.01); *H02M 2001/0009* (2013.01); *H02M 2001/0032* (2013.01); *H02M 2001/0048* (2013.01); *H02M 2001/342* (2013.01); *Y02B 70/1466* (2013.01); *Y02B 70/1491* (2013.01); *Y02B 70/16* (2013.01)

(58) Field of Classification Search
CPC .......... H02M 3/156–3/158; H02M 2001/0009; H02M 2001/0048; H03K 17/133; Y02B 70/16; Y02B 70/1466
USPC .......................... 323/222, 271, 272, 282–285
See application file for complete search history.

(56) References Cited

U.S. PATENT DOCUMENTS

| | | | | |
|---|---|---|---|---|
| 8,009,448 B2 * | 8/2011 | Liu | ................... | H02M 3/33569 363/21.01 |
| 8,803,489 B2 * | 8/2014 | Li | ....................... | H02M 1/4216 323/207 |
| 9,343,964 B2 * | 5/2016 | Yan | ....................... | H02M 3/156 |
| 2007/0229044 A1 * | 10/2007 | Visairo-Cruz | .......... | H02M 1/10 323/282 |

* cited by examiner

*Primary Examiner* — Yemane Mehari

(57) ABSTRACT

A switch-mode DC converter configured to generate a converted voltage from an input voltage is provided. The switch-mode DC converter includes an inductor configured to store energy, and a switch coupled with the inductor at a switching node, wherein the switch is configurable to be turned on or off to control the discharging of the energy stored at the inductor to an output node of the converter, wherein the output node is configured to provide the converted voltage. The switch-mode DC converter also includes a circuit configured to control a timing of turning-off of the switch based on a voltage difference between the switch, wherein a measurement of the voltage difference is adjusted based on a voltage at the switching node.

17 Claims, 17 Drawing Sheets

DC-DC CONVERTER WITH IMPROVED DISCONTINUOUS CONDUCTION MODE EFFICIENCY

RELATED APPLICATION

This application claims priority to U.S. Provisional Patent Application No. 62/011,401, filed on Jun. 12, 2014, the content of which is hereby incorporated by reference in its entirety.

FIELD

The present disclosure generally relates to the field of DC-DC conversion, particularly to integrated switch-mode converters with improved efficiency in light load conduction modes.

BACKGROUND

DC to DC converters are often used to provide stable and efficient voltage sources for electronic systems. A boost or step-up converter is a type of DC-DC converter that provides a higher output voltage than its input voltage. For example, an input battery voltage can be boosted to a desired higher voltage to provide a consistent power supply to an electronic system, e.g., a higher working voltage as required by a string of LED's. The load of a DC-DC converter can vary over a wide range and the converter is often required to work in different modes. When the DC-DC converter operates in a continuous conduction mode (CCM), the load fully utilizes the power supplied by the input power source during each switching period. On the other hand, when a converter operates in a discontinuous conduction mode (DCM), where the load demands a lower current from the power source, the current supplied to the output goes to zero during all or part of the switching period. DC-DC converters are often required to have good overall converter efficiency in both modes of operation and under various power demand scenarios.

FIG. 1 illustrates a boost-type converter, which can perform a DC-DC step up conversion. Referring to FIG. 1, circuit 100 includes a voltage source at node VIN, which is a voltage level equal to input voltage. An inductor 102 connects between the VIN node and an intermediate switching node LX. Two switches, 104 and 106, are connected to the intermediate switching node LX. Both switches 104 and 106 can be power MOS transistors. Switch 104 is connected between the intermediate switching node LX and ground node GND, and is configured to charge inductor 102. Switch 106 is connected between the intermediate switching LX node and an output node VOUT and acts as a discharging switch. An output capacitor 110 is also connected to the output node VOUT of the boost converter. Switch 106 discharges inductor 102 by redirecting the stored energy in the inductor to charge the output capacitor 110.

Basic operation of the boost converter starts with the application of the input pulse to switch 104 (e.g., at node gate1), which causes switch 104 to short the intermediate switching node LX to the ground. A current starts to flow through the inductor 102, energizing the inductor. During this time, switch 106 is open. Next phase occurs when the switch 102 opens and a pulse is applied to switch 106 (e.g., at node gate2). During this time, there is a conduction path through inductor 102 and switch 106 to capacitor 110 and load 112. While the charge stored at capacitor 110 drains through the load, it is recharged during each switching period. The pulses are provided by controller 108, which can set the width of the pulses to maintain a predetermined level of output voltage across load 112.

FIG. 2A illustrates the control waveforms for switches 102 and 104, and the resulting steady-state current waveform for Continuous Conduction Mode (CCM). This is the normal operating mode for loads close to the maximum intended value for the converter. As shown in diagram 200 of FIG. 2A, during cycle time T1, switch 104 is turned on as a result of a pulse voltage at node gate1, and the current through inductor 102 ramps up. During cycle time T1, switch 106 is turned off. On the other hand, during cycle time T2, switch 104 is turned off, and switch 106 is turned on, and inductor 102 is configured to charge capacitor 110 and load 112, causing the current through inductor 102 to drop. The ratio between cycle times T1 and T2 can be chosen to maintain the output voltage at a predetermined level.

FIG. 2B illustrates the control waveforms for switches 104 and 106, and the resulting steady-state current waveform for Discontinuous Conduction Mode (DCM). This is the normal operating mode for light loads or no load. As shown in diagram 250 of FIG. 2B, during cycle times T1 and T2, one of switches 104 and 106 is turned off. During cycle time T2, the current of inductor 102 drops to zero. During cycle time T3, both switches 104 and 106 are switched off, and the current of inductor 102 remains at zero. The proportions of cycle times T1 and T2 relative to the period (i.e., the sum of T1, T2, and T3) can be chosen to maintain the output voltage at a predetermined level.

Although the efficiency of most DC-DC converters reaches a maximum in CCM at near maximum load conditions, efficiency at light loads is often more important for battery operated equipment as this usually represents the nominal working condition. Hence the optimization of efficiency in DCM is important for good operating life of portable equipment.

In DCM, a discharging switch (e.g., switch 106) can be turned off before the end of the switching period. The turn-off time for the discharging switching can be when the inductor has been fully discharged, such that all of the stored energy in the inductor has been transferred to the load, and the energy in the inductor is at zero. A difficult aspect of designing a DC-DC converter in DCM is the accurate determination of when the inductor current has reached zero, which then determines when to turn off the discharging switch. Operation conditions and device properties can reduce the accuracy in the zero-current determination, while propagation delay can affect the timing of turning-off of the switch notwithstanding the accuracy of the zero-current determination.

SUMMARY

Reference will now be made in detail to the exemplary embodiments consistent with the embodiments disclosed herein and the examples of which are illustrated in the accompanying drawings. Wherever possible, the same reference numbers will be used throughout the drawings to refer to the same or similar parts.

The present disclosure provides a switch-mode DC converter configured to generate a converted voltage from an input voltage. The converter comprises an inductor configured to store energy, and a switch coupled with the inductor at a switching node, wherein the switch is configurable to be turned on or off to control the discharging of the energy stored at the inductor to an output node of the converter, and wherein the output node is configured to provide the converted voltage. The converter further comprises a circuit configured to control a timing of turning-off of the switch based on a voltage difference between the switch, wherein a measurement of the voltage difference is adjusted based on a voltage at the switching node.

In some embodiments, the circuit further comprises a first comparator configured to measure the voltage difference; and wherein the timing of turning-off of the switch is controlled based on an output voltage of the first comparator. In some embodiments, the first comparator further includes an offset adjustment block configured to introduce an offset in the first comparator, wherein the offset is adjusted based on the voltage at the switching node. In some embodiments, the first comparator includes a first transistor coupled with a first current source at a first node and a second transistor coupled with a second current source at a second node; wherein the first transistor is coupled with a first terminal of the switch and the second transistor is coupled with a second terminal of the switch; and wherein the comparison between the voltage at the switching node and the converted voltage is based on a voltage difference between the first node and the second node. In some embodiments, the offset is introduced by injecting an offset current at one of the first and second nodes. In some embodiments, the first comparator is turned off during a time when the inductor is being charged. In some embodiments, the circuit is further configured to measure the voltage difference between the switch and to sample the voltage at the switching node periodically; wherein a period of the measurement and the adjustment is determined based on a plurality of samples of the voltage at the switching node.

In some embodiments, the circuit further includes one or more second comparators configured to compare between the voltage at the switching node and one or more threshold voltages; and wherein the offset is adjusted based on one or more output voltages of the one or more second comparators. The one or more threshold voltages can be generated based on the input voltage, the converted voltage, or from a ground potential.

In some embodiments, the circuit includes two second comparators configured to compare the voltage at the switching node against two threshold voltages and to generate a first output voltage and a second output voltage; wherein the offset is increased when the first output voltage exceeds a first predetermined value; and wherein the offset is reduced when the second output voltage exceeds a second predetermined value.

In some embodiments, the circuit includes a second comparator and a multiplexer; wherein the multiplexer is configured to select a threshold voltage from a set of threshold voltages; wherein the second comparator is configured to compare the voltage at the switching node against the selected threshold voltage.

In some embodiments, the switch-mode DC converter further comprises a counter and one or more samplers; wherein the one or more samplers are configured to sample the one or more output voltages of the one or more second comparators; and wherein the counter is configured to store a value and to update or maintain the stored value based on one or more outputs of the one or more samplers; and wherein the offset is adjusted based on the stored value. In some embodiments, the one or more samplers include a latch; and wherein the latch is timed based on a control signal configured to turn on or off the switch. In some embodiments, the switch-mode DC converter further includes one or more digital filters configured to filter the one or more outputs of the one or more samplers; wherein the counter is configured to update the stored value based on one or more outputs of the one or more digital filters. In some embodiments, the stored value is updated based on a target value.

DETAILED DESCRIPTION OF THE EMBODIMENTS

As discussed before, operation conditions and device properties can reduce the accuracy in the zero-current determination, while propagation delay can affect the timing of turning-off of the discharging switch notwithstanding the accuracy of the zero-current determination. Although some of the inaccuracies can be mitigated by manual trimming, such an arrangement is not self-correcting, and may only cover a small range of inaccuracies.

Reference will now be made in detail to specific implementations that seek to overcome the foregoing shortcomings of current systems. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Embodiments of the present disclosure provide a switch-mode DC converter configured to generate a converted voltage from an input voltage. The converter includes an inductor configured to store energy. The converter also includes a switch coupled with the inductor at a switching node, wherein the switch is configurable to be turned on or off to control the discharging of the energy stored at the inductor to an output node of the converter, wherein the output node is configured to provide the converted voltage. The converter further includes a circuit configured to control a timing of turning-off of the switch based on a voltage difference between the switch, wherein a measurement of the voltage difference is adjusted based on a voltage at the switching node (e.g., switching node LX). The voltage at the switching node can be sampled to determine whether a timing of the turn-off of the switch is too early or too late, and the timing can be adjusted accordingly. In some embodiments, the circuit includes a comparator configured to measure the voltage difference between the switch, and the timing of the turn-off of the switch can be adjusted by introducing or modifying an offset of the comparator.

Figure 1:
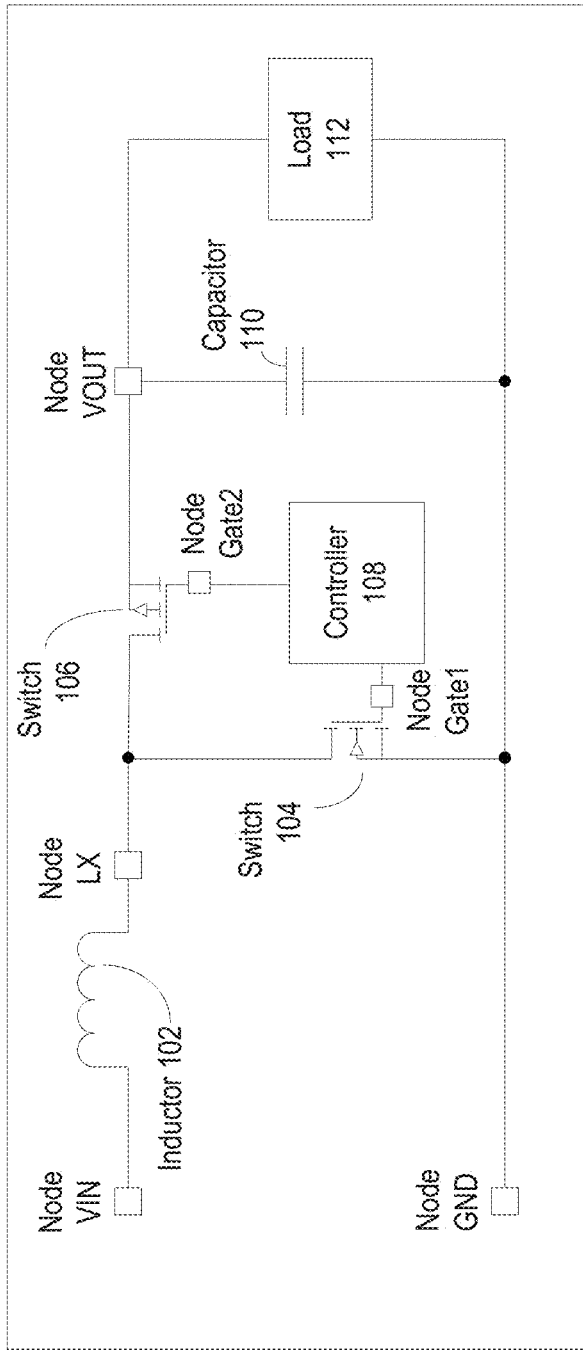
FIG. 1 illustrates a circuit schematic of a prior art boost converter.

With embodiments of the present disclosure, the timing of turning off the discharging switch (e.g., switch 106 of FIG. 1) can be determined automatically using a feedback loop, where the timing can be evaluated and adjusted based on signals collected at the switching node LX. The signals at the switching node LX can provide a measurement of the effectiveness of the adjustment. The feedback loop also enables the determination of the timing to be self-correcting over time, different load conditions, different operating conditions, temperature and other parametric changes of the circuit. As a result, the system can become more robust. The method and system for determining the timing of the discharging switch can be applied to any type of switch-mode converters, including Boost converter, Buck converter, and Buck-Boost convert.

Figure 2A:
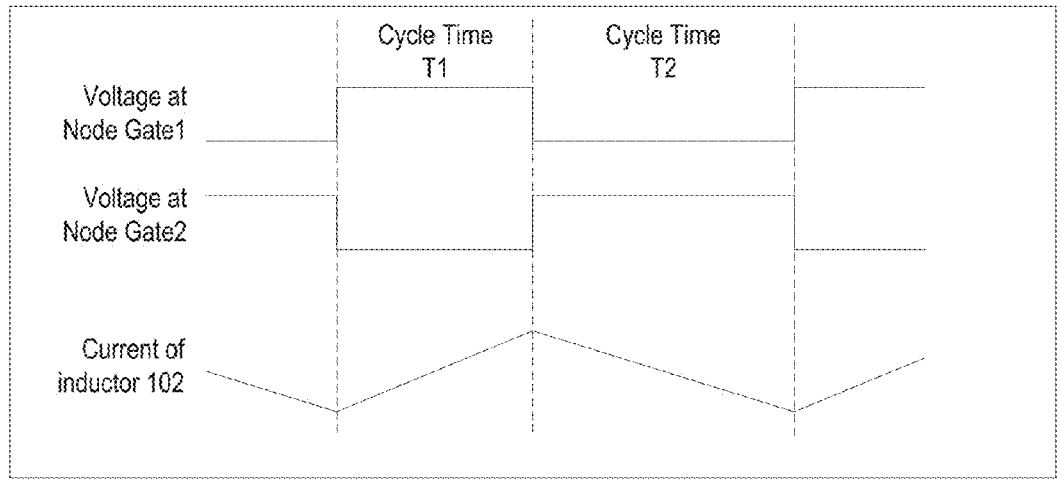
FIGS. 2A and 2B illustrate a CCM waveform and a DCM waveform of a prior art boost converter.
Figure 2B:
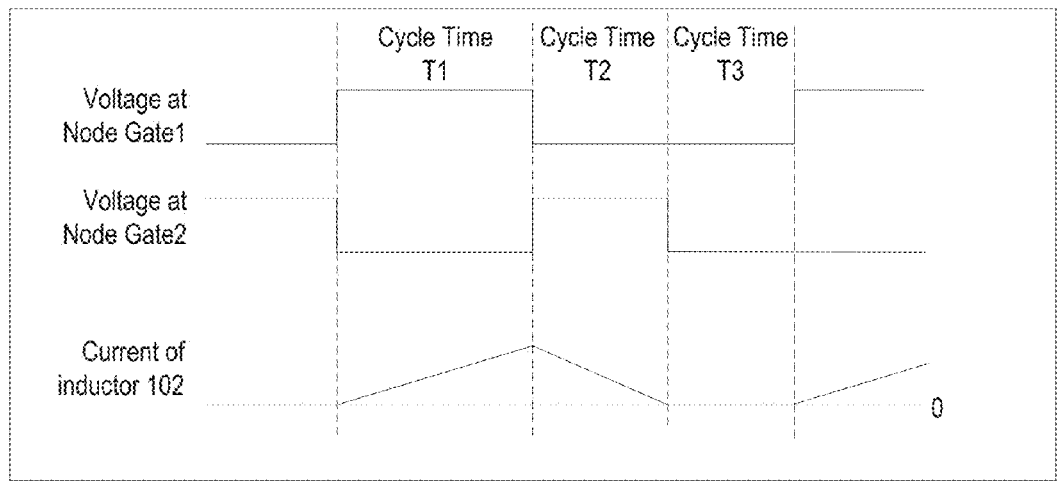
Figure 3:
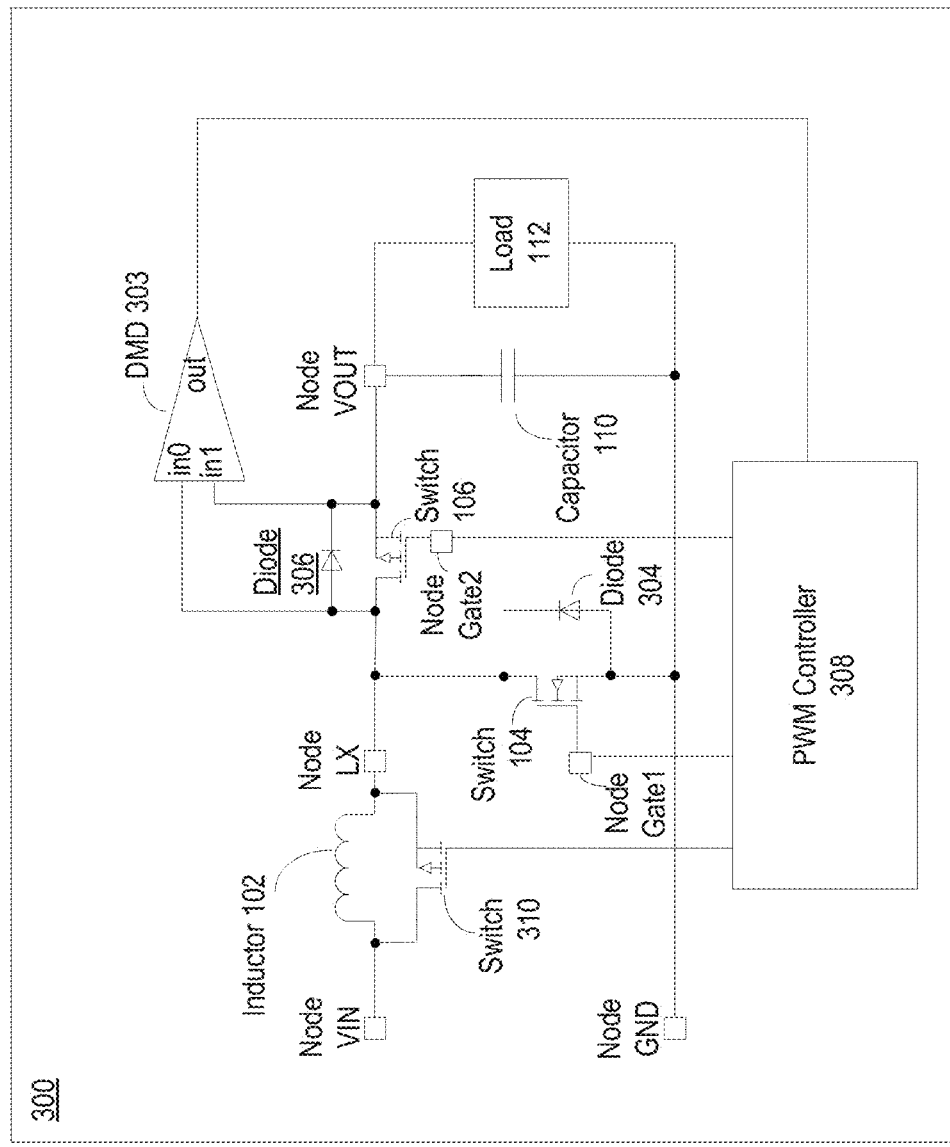
FIG. 3 illustrates a circuit schematic of an exemplary boost converter with a discontinuous mode detector (DMD), consistent with embodiments of the present disclosure.

FIG. 3 illustrates a boost-type converter that includes a Discontinuous Mode Detector (DMD). As shown in FIG. 3, circuit 300 includes inductor 102, switches 104 and 106, capacitor 110, and load 112 connected in a similar configuration as circuit 100 of FIG. 1. Circuit 300 also includes a pulse-width-modulator (PWM) controller 308 which can be used to implement controller 108 of FIG. 1 and to provide gate pulses for switches 104 and 106. Circuit 300 also includes a parasitic diode 304 across switch 104, and a parasitic diode 306 across switch 106. As to be discussed below, parasitic diodes 304 and 306 can become forward-biased during the operation and conduct current, which lead to current loss and reduced efficiency. In some embodiments, circuit 300 also includes shows a switch 310 connected across inductor 102. In some embodiments, switch 310 is configured to mitigate ringing at the switching node LX due to any residual energy in the inductor 102 at the end of the DCM switching cycle. Switch 310 can be turned on when both switches 104 and 106 are off (e.g., during cycle time T3 of FIG. 2B).

Circuit 300 also includes DMD 303 that is connected across switch 106. In some embodiments, DMD 303 is configured to monitor the output current in the phase when the current of inductor 102 decreases while the inductor is discharging to provide stored energy to capacitor 110 and load 112 (e.g., cycle time T2 of FIG. 2B), and to provide an output signal when the current approaches zero. In some embodiments, DMD 303 includes a comparator that can provide a digital signal as an input to the PWM Controller 308. In some embodiments, the DMD includes terminals in0 and in1, with switch 106 connected between the terminals. DMD 303 can then monitor the current at the inductor by monitoring a voltage across switch 106, and/or a voltage across a resistance that is in series with switch 106 (not shown in FIG. 3), and to provide a signal indicating a zero value. To improve efficiency, the DMD detected voltage across switch 106 and/or across the resistance in series with switch 106 can be designed to be at a small value.

Figure 4:
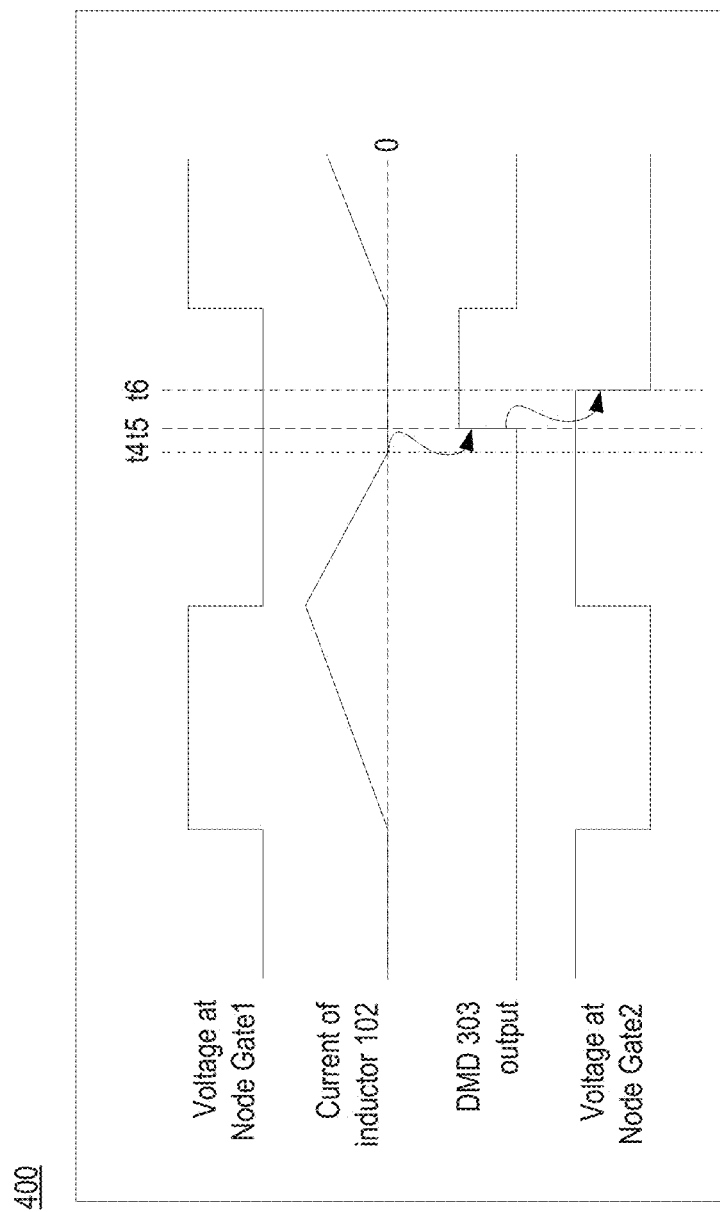
FIG. 4 illustrates the operation waveforms of the exemplary boost converter of FIG. 3, consistent with embodiments of the present disclosure.

The operation of DMD 303 is illustrated in FIG. 4. As shown in FIG. 4, after DMD 303 detects that the current of inductor 102 approaches (or crosses) zero at time t4, DMD 303 can output a pulse at time t5. The pulse can then cause PWM Controller 308 to turn off switch 106 by, for example, lowering the voltage at node gate2, at time t6.

Figure 5A:
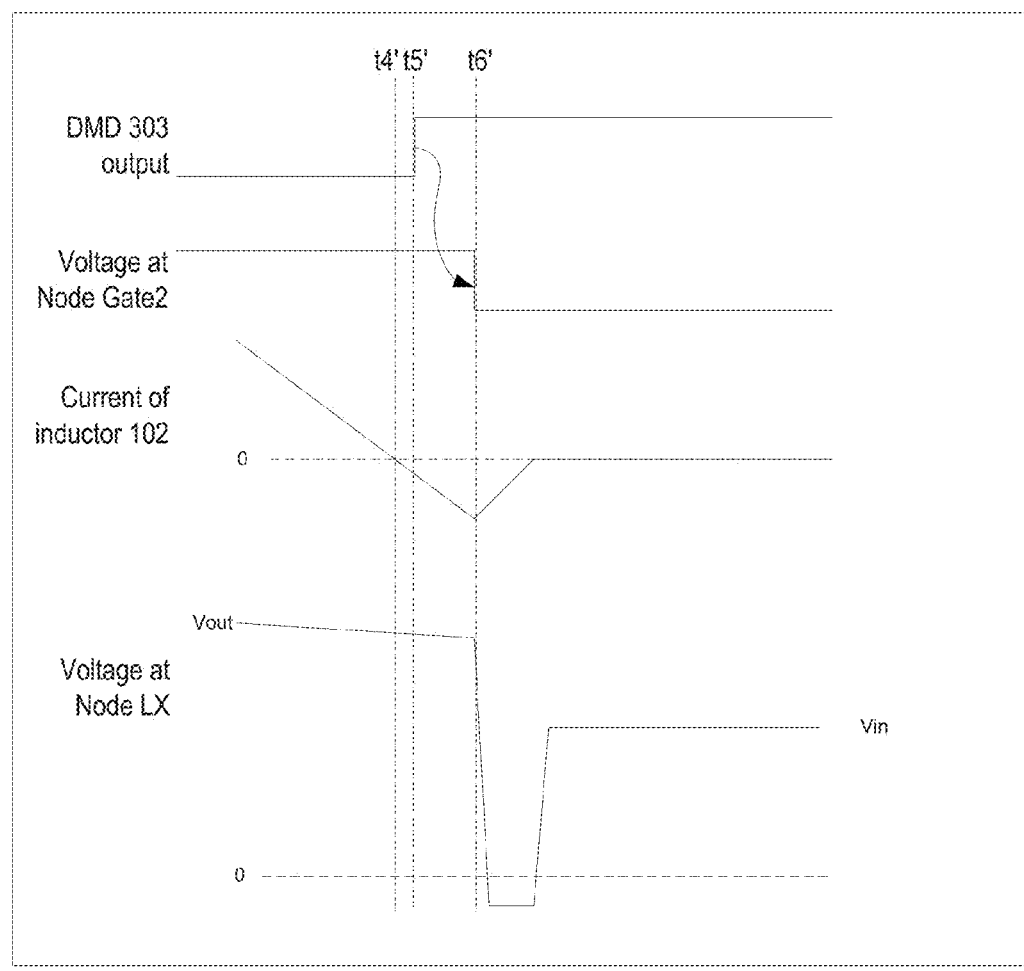
FIGS. 5A and 5B illustrate the operation waveforms of booster converter of FIG. 3 under certain operation conditions.

The delay between inductor current dropping to zero and the turning off of switch 106 can be maintained at a predetermined value to improve efficiency. Reference is now made to FIG. 5A, which illustrates the effect of late detection of true zero current in the inductor (and/or late turning-off of switch 106). Late detection can occur due to, for example, variation in operating point, component properties, output loading, propagation delay, etc. of circuit 300. For example, there can be an offset in the comparator of DMD 303, which can cause DMD 303 to output a pulse after the current in the inductor already drops below zero. As shown in diagram 500 of FIG. 5A, the current of inductor 102 drops to zero at t4' and DMD 303 outputs a pulse at t5', which causes switch 106 to turn off at t6'. Between t4' and t5' the inductor current reverses direction (becomes negative), and at t6' when switch 106 turns off, voltage at node LX becomes negative. The negative voltage at node LX causes parasitic diode 304 across switch 104 to be forward-biased and to draw current from the input supply, leading to additional loss and reduced efficiency.

Figure 5B:
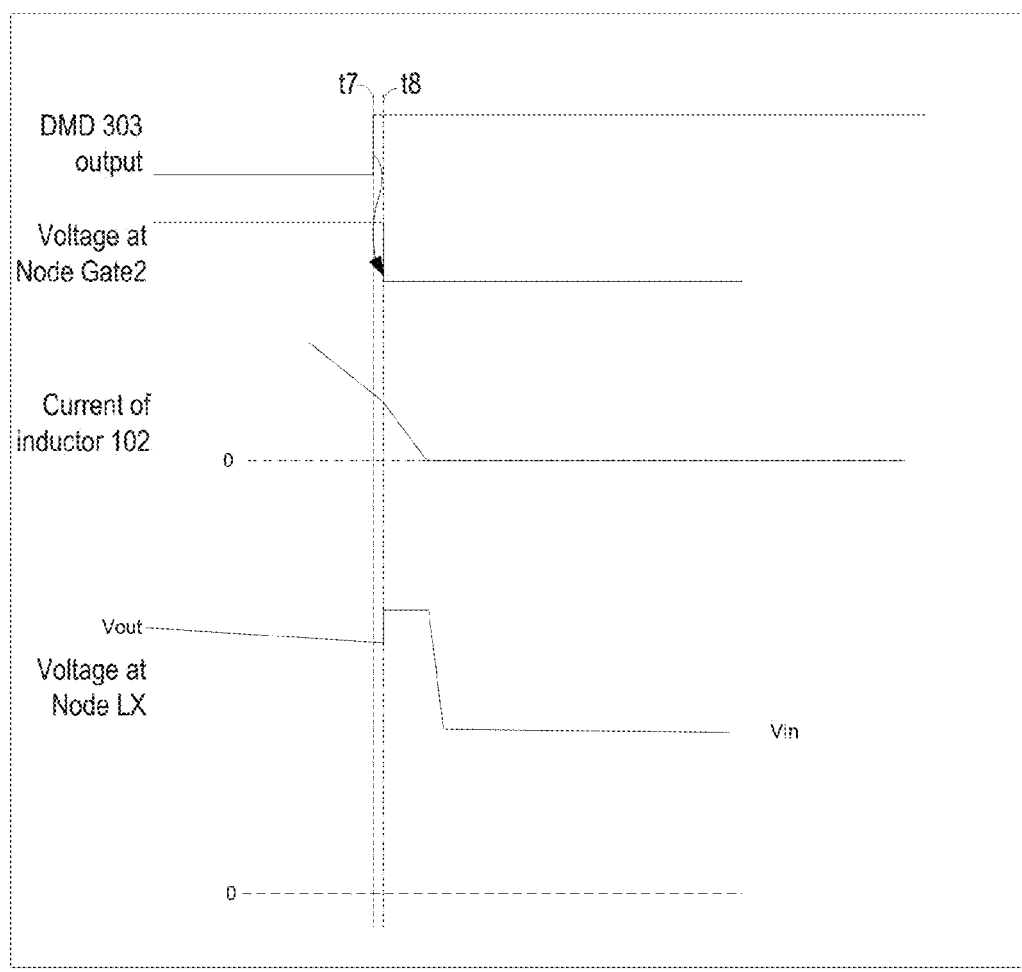

On the other hand, having switch 106 turned off early can also reduce efficiency. Reference is now made to FIG. 5B, which illustrates the effect of early detection of true zero current in the inductor (and/or early turning-off of switch 106). Similar to late detection, early detection can occur due to, for example, variation in operating point, component properties, output loading, etc. of circuit 300. For example, there can be an offset in the comparator of DMD 303, which can cause DMD 303 to output a pulse before the current in the inductor reaches zero. As shown in diagram 550 of FIG. 5B, DMD outputs a pulse at time t7, but the current of inductor 102 is not yet at zero. As a result, when switch 106 switches off at time t8, the residual energy in the inductor may cause the voltage at the node LX to increase to a level higher than at node VOUT. Parasitic diode 306 can then become forward-biased, and a current can across the diode from power supply, again resulting in additional losses and lowering the overall efficiency.

Figure 6:
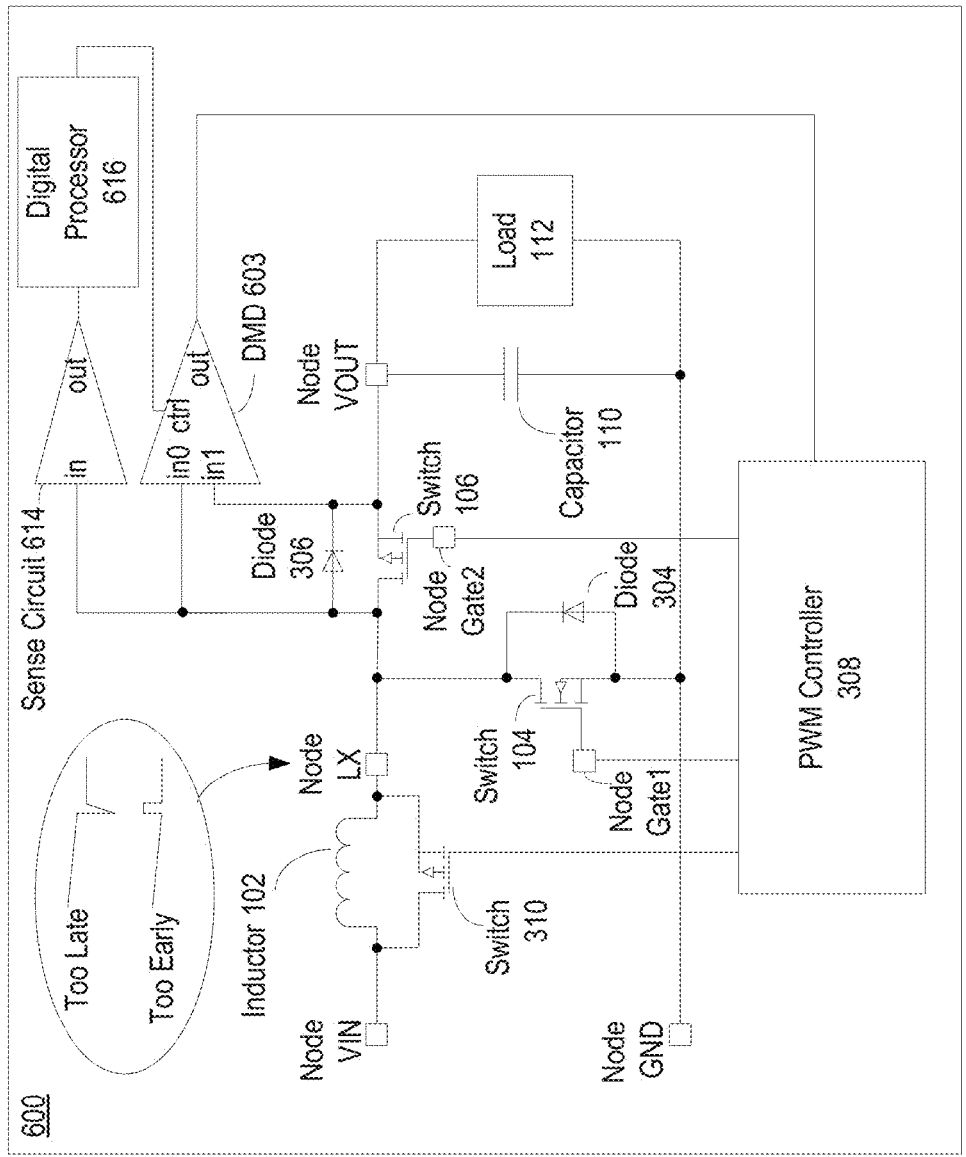
FIG. 6 illustrates a circuit schematic of an exemplary boost converter with a DMD and associated control circuitry, consistent with embodiments of the present disclosure.

FIG. 6 illustrates a converter that provides improvement of control over the delay between the turning-off of switch 106 and the occurrence of zero current at inductor 102, consistent with embodiments of the present disclosure. As shown in FIG. 6, circuit 600 includes inductor 102, switches 104 and 106 (and their associated parasitic diodes 304 and 306), capacitor 110, load 112, PWM Controller 308, and switch 310 connected in a similar configuration as circuit 300 of FIG. 3.

In some embodiments, circuit 600 also includes a DMD 603, a sense circuit 614, and a digital processor 616. Sense circuit 614 can monitor the voltage at node LX just after the switch 106 is turned off (i.e. opens). Similar to DMD 303 of FIG. 3, DMD 603 can also control the time at which switch 106 opens, by monitoring the current at inductor 102. At the instant before switch 106 opens, the voltage at node LX is approximately equal to the voltage at node VOUT. As discussed before, depending on when switch 106 is opened, the energy in inductor 102 can be completely depleted, and voltage at node LX can decay to a voltage equal to node VIN, where the voltage across inductor 102 (and the energy stored therein) is substantially zero. On the other hand, various factors (e.g., operation conditions and component properties, propagation delay, etc.) can affect the accuracy of detecting zero current at the inductor by the DMD, which in turn affects the time at which DMD causes switch 106 to turn off.

In some embodiments, the operation of the DMD (e.g., the triggering condition for generation of the pulse that causes switch 106 to turn off) can be controlled according to the voltage at node LX, to improve the likelihood of complete depletion of inductor current when switch 106 is turned off. In some embodiments, as shown in FIG. 6, sense circuit 614 can monitor the voltage at node LX, after switch 106 is turned off, and provide the monitoring result to digital processor 616. Digital processor 616 can then process the monitoring result by, for example, detecting a variation of voltage that shows switch 106 is turned off too late or too early. Digital processor 616 can then control the operation of DMD 603 based on the processing result. Although FIG. 6 shows that DMD 603, sense circuit 614 and digital processor 616 as separate blocks, it is understood that these blocks can be combined together.

In some embodiments, sense circuit 614 and digital processor 616 can be disabled during parts of the DCM switching cycle, or when the converter is configured to operate in CCM where the inductor current never falls to zero. For example, referring back to FIG. 2B, sense circuit 614 and digital processor 616 can be turned off during cycle time T1, to reduce power. Moreover, since sense circuit 614 and digital processor 616 are configured to monitor the LX node voltage after both switches 104 and 106 are turned off, sense circuit 614 and digital processor 616 can be turned off during cycle time T2 as well, to further reduce power.

Figure 7:
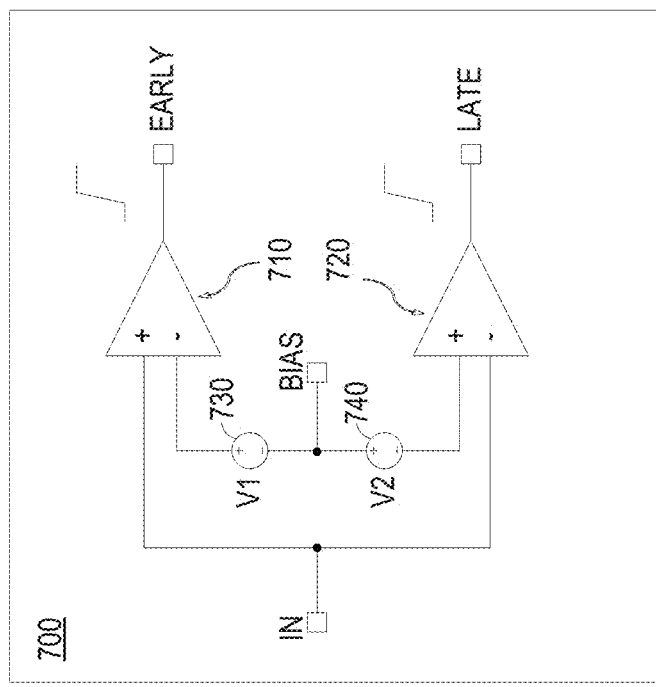
FIGS. 7-9 illustrate circuit schematic of exemplary sense circuits, consistent with embodiments of the present disclosure.

FIG. 7 illustrates an exemplary circuit 700 which can be used to implement sense circuit 614, consistent with embodiments of the present disclosure. As shown in FIG. 7, circuit 700 includes a comparator 710 and a comparator 720. The positive pin of comparator 710 and the negative pin of comparator 720 are connected to a pin IN, which can be connected to the LX node of circuit 600 to sense the voltage at that node. The outputs of circuit 700 are EARLY and LATE pins. As to be discussed below, the signals at the EARLY pin and the LATE pin can be transmitted to digital processor 616 for further processing to generate control signals for DMD 603.

In some embodiments, the negative pin of comparator 710 and the positive pin of comparator 720 are connected to different voltage sources 730 and 740, where each respectively supplies a voltage of V1 and V2, and can provide different trigger voltage thresholds. The trigger voltage thresholds can be generated with reference to a voltage at BIAS node. The voltage at BIAS node can be equal to an expected voltage at the LX node when there is zero voltage across inductor 102, which is equal to the voltage at the VIN node. In some embodiments, the threshold voltage for comparator 710 can be set at a voltage V1 (e.g. 0 v) above the VIN voltage, and the threshold voltage for comparator 720 can be set at a voltage V2 (500 mV) below the VIN voltage. With such arrangements, comparator 710 can detect a scenario where switch 106 is turned off too early, which leads to the voltage of node LX to exceed the threshold voltage of comparator 710 (VIN+V1), and generate a signal at the EARLY pin to indicate such a scenario. Moreover, comparator 720 can also detect a scenario where switch 106 is turned off too late, which leads to the voltage of node LX to fall below the threshold voltage of comparator 720 (VIN−V2), and generate a signal at the LATE pin to indicate such a scenario. Although FIG. 7 shows that the trigger voltages are set by voltage sources, it is understood that the trigger voltages can also be set with resistor networks and/or current sources.

Figure 8:
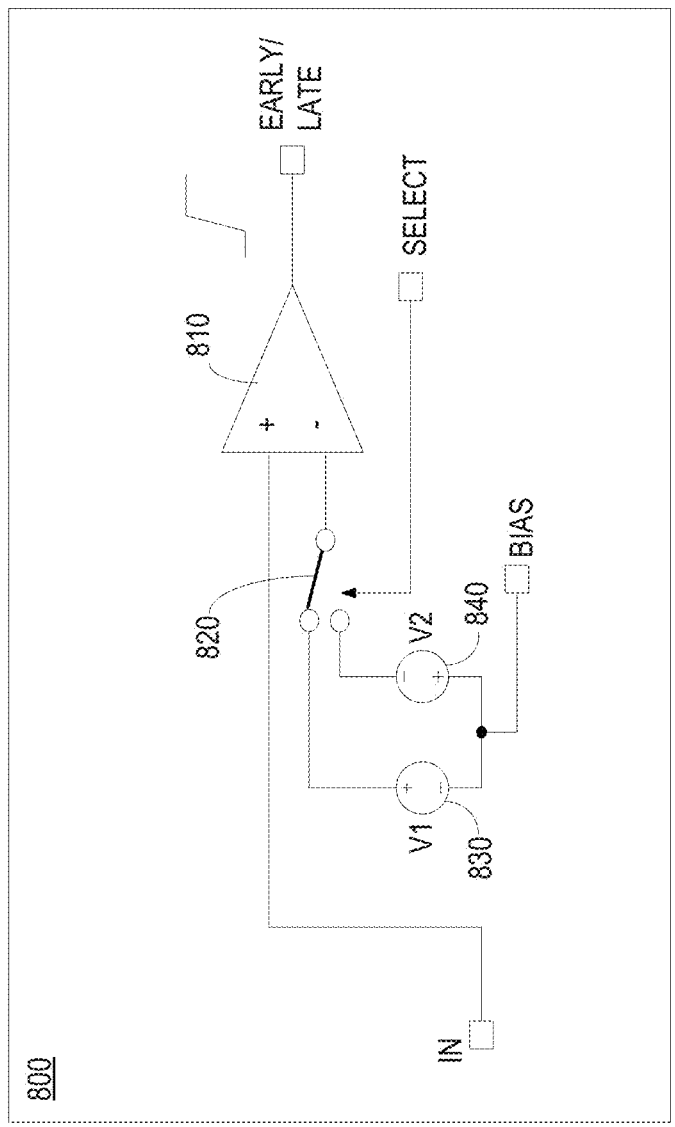

FIG. 8 illustrates an exemplary circuit 800 which can be used to implement sense circuit 614, consistent with embodiments of the present disclosure. As shown in FIG. 8, circuit 800 includes a comparator 810, and a multiplexer 820 configured to select the trigger threshold voltage for comparator 810 between two values (BIAS+V1 and BIAS−V1), which are set by voltage sources 830 and 840 relative to the BIAS pin voltage. Similar to circuit 700, the voltage at the BIAS pin can be set at a voltage equal to the VIN pin, and the threshold voltages are switched based on a SELECT signal. In some embodiments, the SELECT signal can be toggled, and based on the value of the SELECT signal, the output of comparator 810 can be interpreted to provide the same information as provided by the EARLY pin or the LATE pin of circuit 700.

Figure 9:
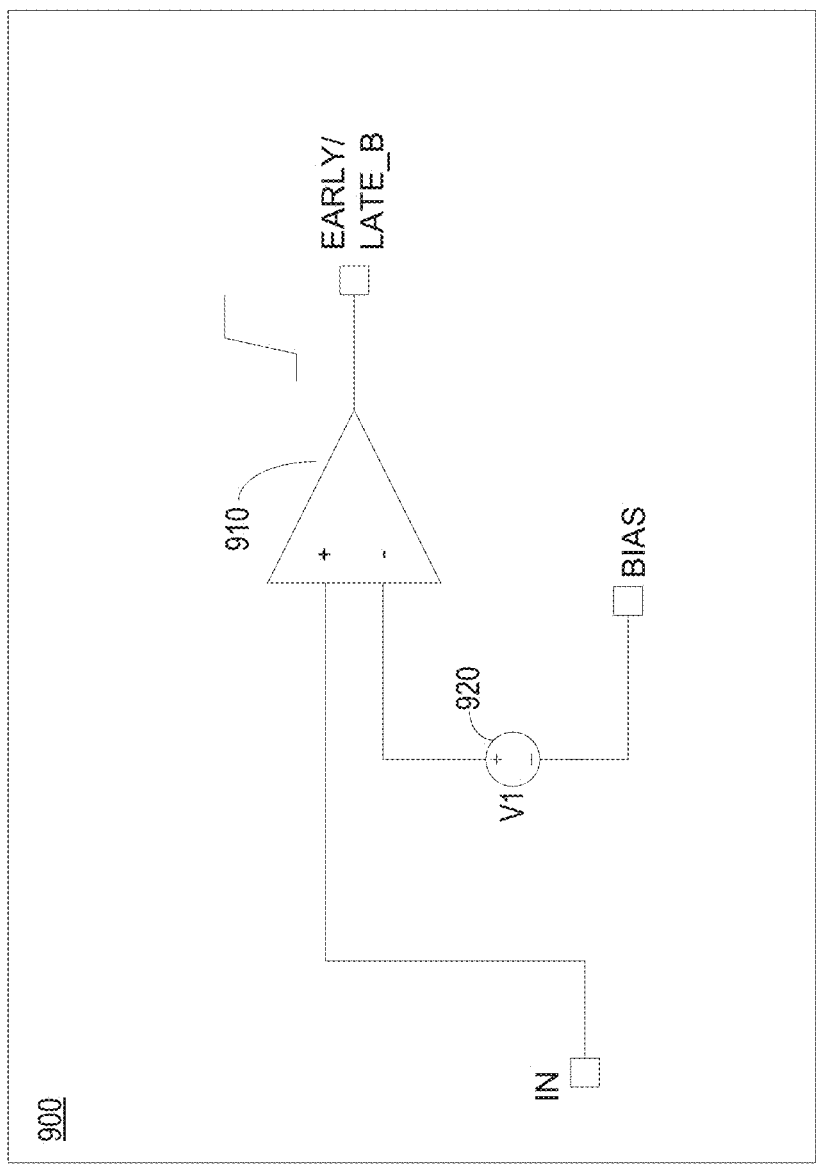

FIG. 9 illustrates an exemplary circuit 900 which can be used to implement sense circuit 614, consistent with embodiments of the present disclosure. As shown in FIG. 9, circuit 900 includes a comparator 910 which is configured to sense a voltage at the IN pin and compare it with a single voltage threshold. The single threshold can be generated by voltage source 920 with respect to the voltage at the BIAS pin. In some embodiments, the threshold can be equal to the BIAS voltage (e.g. voltage at node VIN) with V1 equals to zero. When the output of circuit 900 is high, the output is interpreted as indicating the same scenario as the assertion of the EARLY pin of circuit 700. When the output of circuit 900 is low, the output is interpreted as indicating the same scenario as the assertion of the LATE pin of circuit 700 (hence denoted as LATE_B).

Figure 10A:
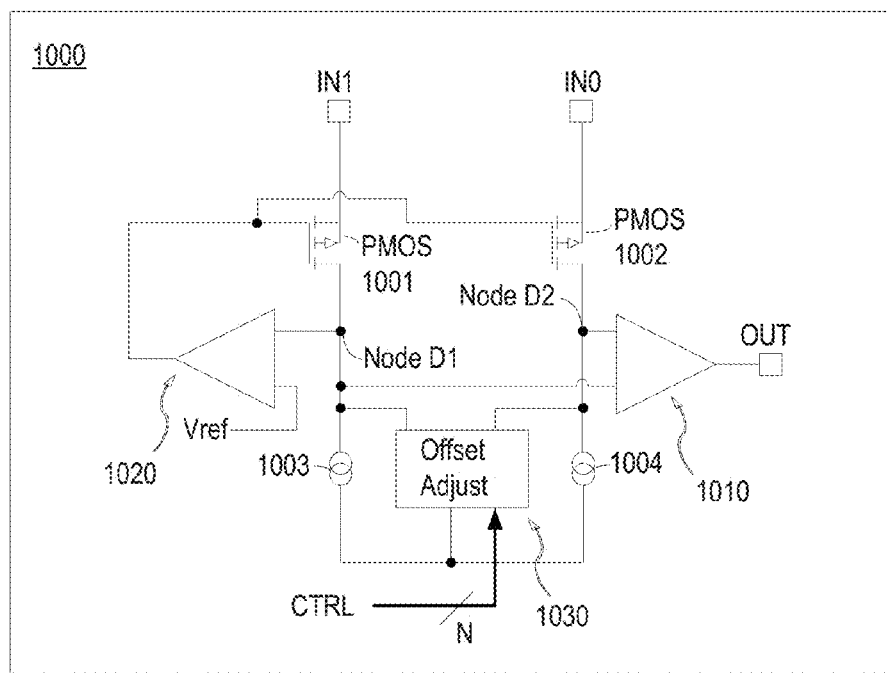
FIGS. 10A and 10B illustrate circuit schematics of an exemplary DMD, consistent with embodiments of the present disclosure.

FIG. 10A illustrates an exemplary circuit 1000 which can be used to implement DMD 603 of FIG. 6, consistent with embodiments of the present disclosure. As shown in FIG. 10A, circuit 1000 includes PMOS transistors 1001 and 1002, current sources 1003 and 1004, comparator 1010, and Op-Amp 1020. In some embodiments, PMOS transistors 1001 and 1002 are matched devices, and are biased at substantially the same current density by the two current sources 1003 and 1004. Current sources 1003 and 1004 can include any NMOS current sources (e.g., cascode). The source of transistor 1001 is connected to IN1, which can be connected to node VOUT of circuit 600 of FIG. 6. The source of transistor 1002 is connected to IN0, which can be connected to the node LX of circuit 600. Circuit 1000 is balanced when the voltage at node LX is the same as the voltage at VOUT, i.e. when there is no voltage difference across switch 106, which can indicate that current at inductor 102 is zero. When the circuit is balanced, the voltages at drain nodes D1 and D2 are substantially identical. In some embodiments, D1 can be maintained at a value equal to a predetermined value Vref with a feedback loop that includes Op-Amp 1020.

When there is a voltage difference across switch 106 (i.e., the voltage at nodes LX and VOUT are not equal), the drain current in transistor 1002 can become different from the current to be supplied by the current source 1004. The difference in the current can cause the voltage at drain node D2 to deviate from that of drain node D1. Comparator 1010 can digitize the difference between the two drain voltages to produce the output signal, which can then be transmitted to PWM controller 308. PWM controller 308 can then turn off switch 106 to terminate the inductor discharge phase (e.g., cycle time T2 of FIG. 2B) in DCM mode.

Although FIG. 10A shows a combination of PMOS transistor and current sources, it is understood that transistors 1001 and 1002 can be NMOS transistors, and the current sources 1003 and 1004 can include PMOS current sources.

In some embodiments, circuit 1000 also includes an Offset Adjust block 1030 that is connected between drain nodes D1 and D2. Offset Adjust block 1030 can receive information from the CTRL pins, and generate an offset current according to the CTRL pins information. The Offset Adjust block 1030 can apply the offset current to either transistor 1001 or transistor 1002 by injecting an offset current at either node D1 or node D2. The CTRL pins can be used to represent a multi-bit code configured to control the magnitude and direction of the offset current. The resulting offset current changes the relative current density in transistors 1001 and 1002, and can cause a change in switching threshold of circuit 1000 (e.g., the voltage at the LX node that causes the output of comparator 1010 to switch). The offset current can be used to compensate for the errors caused by offsets in the circuits (e.g., caused by mismatch between the transistors 1001 and 1002, offset in comparator 1010, etc.), and the reaction time of comparator 1010.

Figure 10B:
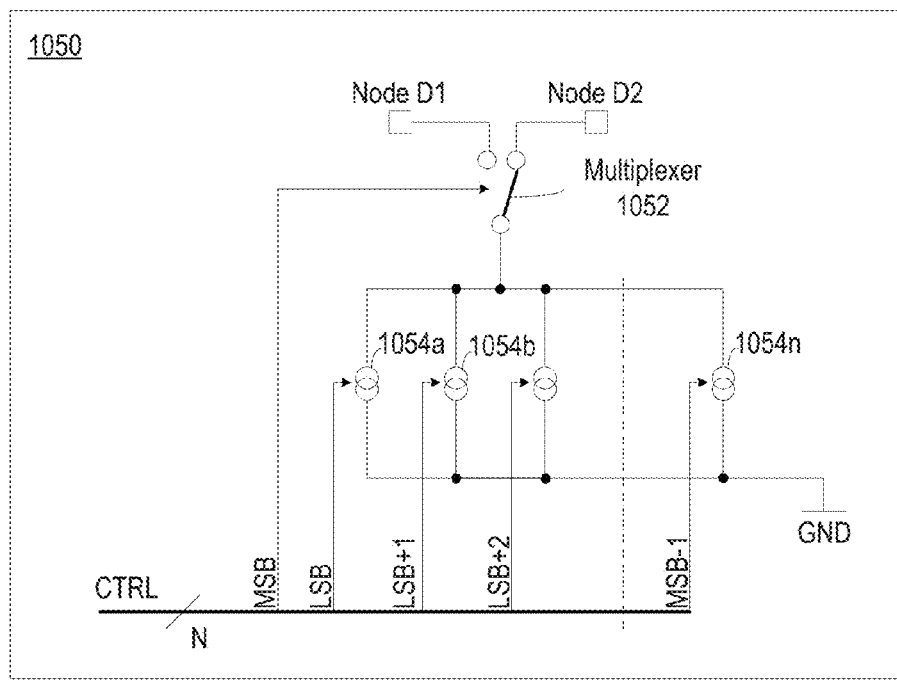

FIG. 10B illustrates an exemplary circuit 1050 which can be used to implement Offset Adjustment block 1030 of FIG. 10A. As shown in FIG. 10B, circuit 1050 can include a multiplexer 1052 and a plurality of current sources 1054, each controlled (e.g., turned on/off) by one of the bits of the N-bit CTRL pins. In some embodiments, the current sources 1054 can be binary weighted (e.g., current source 1054a being connected to the Least Significant Bit (LSB) and having the smaller current density among the current sources). The Most Significant Bit (MSB) of the N-Bit CTRL pins can be connected to multiplexer 1052, and can be configured to define the direction of the applied offset current, while the rest of the pins are configured to control the magnitude of the applied offset current. The offset current is then injected at either node D1 or node D2 of circuit 1000.

In some embodiments, circuits 1000 and 1050 (when used to implement DMD 603 of FIG. 6) can be turned off during parts of the DCM switching cycle, or when the converter is configured to operate in CCM where the inductor current never falls to zero. For example, referring back to FIG. 2B, circuits 1000 and 1050 can be turned off during cycle time T1, to reduce power. Sense circuit 614 can also be turned off during cycle time T1. In some embodiments, circuits 1000 and 1050 can be turned off by disabling current sources 1003, 1004, and 1054.

Figure 11A:
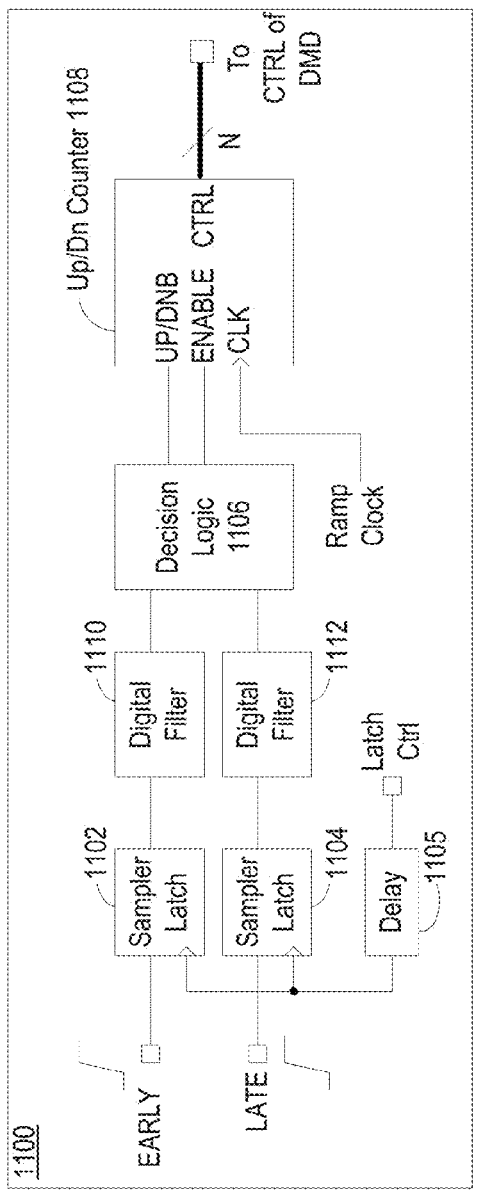
FIGS. 11A-B and 12 illustrate block diagrams of an exemplary digital processor, consistent with embodiments of the present disclosure.

FIG. 11A illustrates an exemplary circuit 1100 which can be used to implement digital processor 616, consistent with embodiments of the present disclosure. As shown in FIG. 11A, circuit 1100 includes sampler latches 1102 and 1104, a delay element 1105, a decision logic 1106, and an up/down counter 1108. In some embodiments, circuit 1100 also includes digital filters 1110 and 1112.

Sampler latches 1102 and 1104 are configured to latch in the EARLY and LATE signals as received from sense circuit 614 (e.g., circuit 700 of FIG. 7). The latching is controlled by the Latch Ctrl pin. In some embodiments, the Latch Ctrl pin can be connected to the gate control signal for switch 106 provided by PMW Controller 308. Such an arrangement allows the EARLY/LATE signals to be sampled just after switch 106 is turned off. In some embodiments, as shown in FIG. 11, the gate control signal can be delayed by delay element 1105 before the signal reaches the sampler latches. The delay provides time for the inductor (e.g., inductor 102) to force the voltage at the node LX to a direction based on the polarity of the residual current in the inductor.

In some embodiments, the outputs of the sampler latches outputs can be digitally filtered (e.g., using any averaging method) by digital filters 1110 and 1112, to eliminate the odd or random signals. As an illustrative example, if the circuit samples 10 cycles, with 8 samples showing early, and 2 samples showing late, the 2 late signals can be treated as noise and discarded. Such an arrangement can improve the consistency of the processing result and the control (e.g., offset current setting) to the DMD. As shown in FIG. 11, digital filter 1110 can be configured to filter the EARLY signals, and digital filter 1112 can be configured to filter the LATE signals. After filtering, each filter can output a high or a low signal to indicate, respectively, whether switch 106 is turned off too early or too late. The signal can then be processed by decision logic 1106.

Figure 11B:
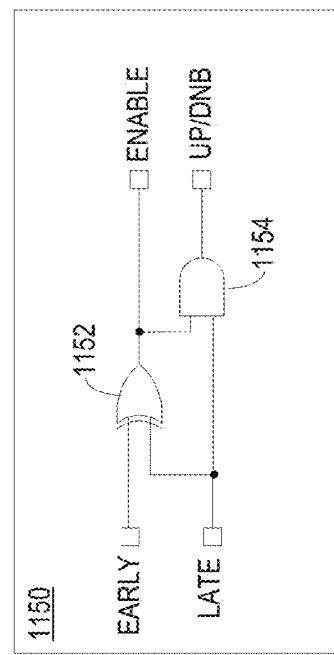

Reference is now made to FIG. 11B, which illustrates an exemplary circuit 1150 which can be used to implement decision logic 1106, consistent with embodiments of the present disclosure. As shown in FIG. 11B, circuit 1150 includes an XOR gate 1152 and an AND gate 1154. Circuit 1150 receives the LATE and EARLY input (either directly from sampler latches 1102 and 1104 or from digital filters 1110 and 1112), and can control the Up/Dn counter 1108 based on a combination of the LATE and EARLY inputs, via the Enable and Up/Down_B signals.

For example, if a high signal is received for the EARLY input and a low signal is received for the LATE input, indicating that switch 106 is turned off early and not late, circuit 1150 can assert the Enable and UP/Down_B signal to cause the counter to count up by 1. If a low signal is received for the EARLY input and a high signal is received for the LATE input, indicating that switch 106 is turned off late and not early, circuit 1150 can assert the Enable and de-assert the Up/Down_B signal to cause the counter to count down by 1. If the received signals show both early and late (i.e., both EARLY and LATE inputs are high) or not early and not late (i.e., both EARLY and LATE inputs are low), circuit 1150 can de-assert the Enable signal, thereby causing the counter to keep the currently-stored counter value. FIG. 11B merely shows an exemplary design. A person have ordinary skill in the art should appreciate that other designs can be used to achieve the same functionalities as described above.

Referring back to FIG. 11A, Up/Dn Counter 1108 can update the counter values based on the Up/Down_B and Enable signals from decision logic 1106 periodically (e.g., once per ramp clock cycle). In some embodiments, the rate of updating the counter values can be made lower (e.g., one per eight ramp clock cycles) to reduce power by, for example, skipping some of the clock cycles from the sampler latches. In some embodiments, circuit 1200 (used to implement digital processor 616) and sense circuit 614 can also be disabled when clock cycles are skipped, to save power. For example, when one set of LATE/EARLY samples is processed for every eight clock cycles, digital processor 616 and sense circuit 614 can be disabled for seven of the eight clock cycles.

The rate of updating the counter values can be modified based on, for example, a variation in the number of LATE/EARLY samples. For example, if within a certain period the number of LATE/EARLY samples varies a lot (with or without filtering), which can indicate that the feedback loop has not reached a steady state, such that the converter, under the control of DMD, is not producing a stable number of LATE/EARLY samples, the rate of updating the counter values can be increased. For example, in this case, digital processor 616 and sense circuit 614 can be configured to skip fewer clock cycles (or even sample the LX node once per clock cycle) to cause the feedback loop to become more responsive, so that the feedback loop can converge more quickly. On the other hand, when the number of LATE/EARLY samples becomes relatively stable, the evaluation and correction of DMD needs not occur in every clock cycle. Digital processor 616 and sense circuit 614 can then be configured to skip more clock cycles between each samples, to save power.

The counter values of Up/Dn Counter 1108 can then be provided to the CTRL pins of DMD 603 (e.g., circuits 1000 and 1050 of FIGS. 10A-10B), where the counter values can be used to control the offset current applied to the DMD, to compensate (or overcompensate) for the mismatches in DMD 603. The subsequent late/early turning off of switch 106 caused by the output of DMD 603, after the adjustment of offset current, can be detected again. The resultant feedback loop allows the DMD output timing to be adjusted continuously and dynamically, so that the switching of DMD output (and the turning off of switch 106) can occur at a time closer to the true zero crossing of the inductor current.

Figure 12:
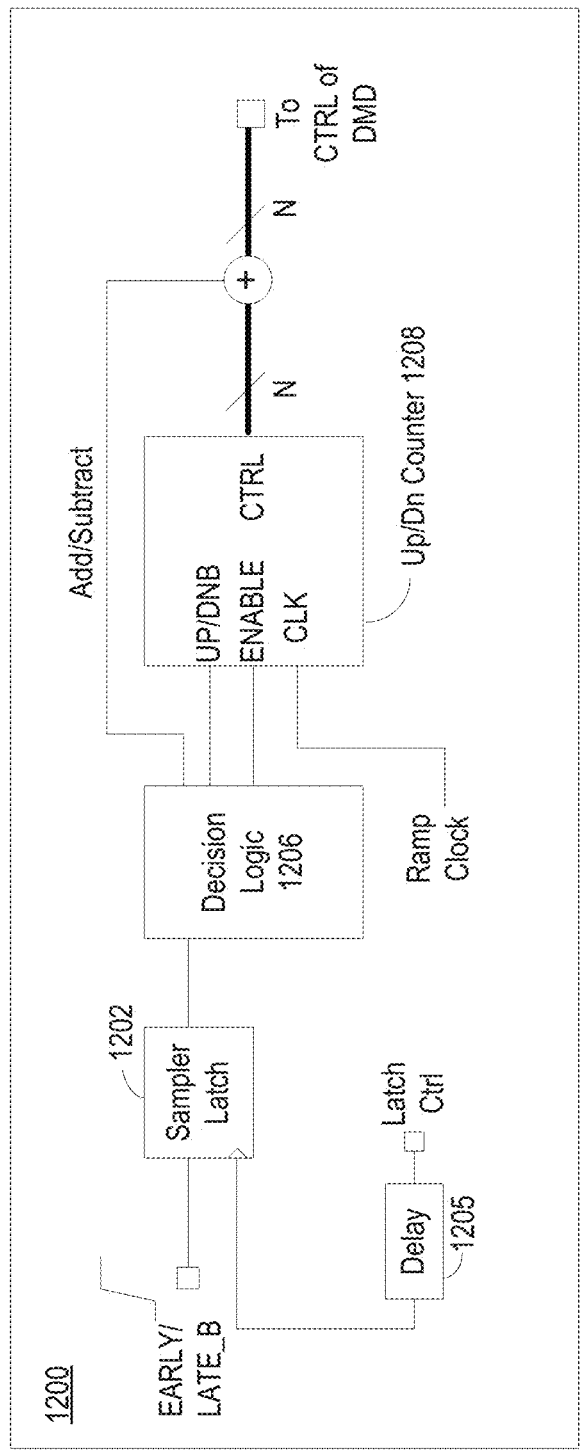

FIG. 12 illustrates an exemplary circuit 1200 which can be used to implement digital processor 616, consistent with embodiments of the present disclosure. In some embodiments, circuit 1200 can be used to process the single EARLY/LATE_B output of circuit 900 of FIG. 9. The operation of circuit 1200 is similar to circuit 1100. In addition, decision logic 1206 can adjust the N-bit CTRL output through the add/subtract line. In some embodiments, the system can run a test to compare the N-bit CTRL value against a target value. If the difference between the values exceeds a certain threshold, decision logic 1206 can either increase or decrease the N-bit CTRL value. Such an arrangement can further improve the accuracy of the system.

Figure 13:
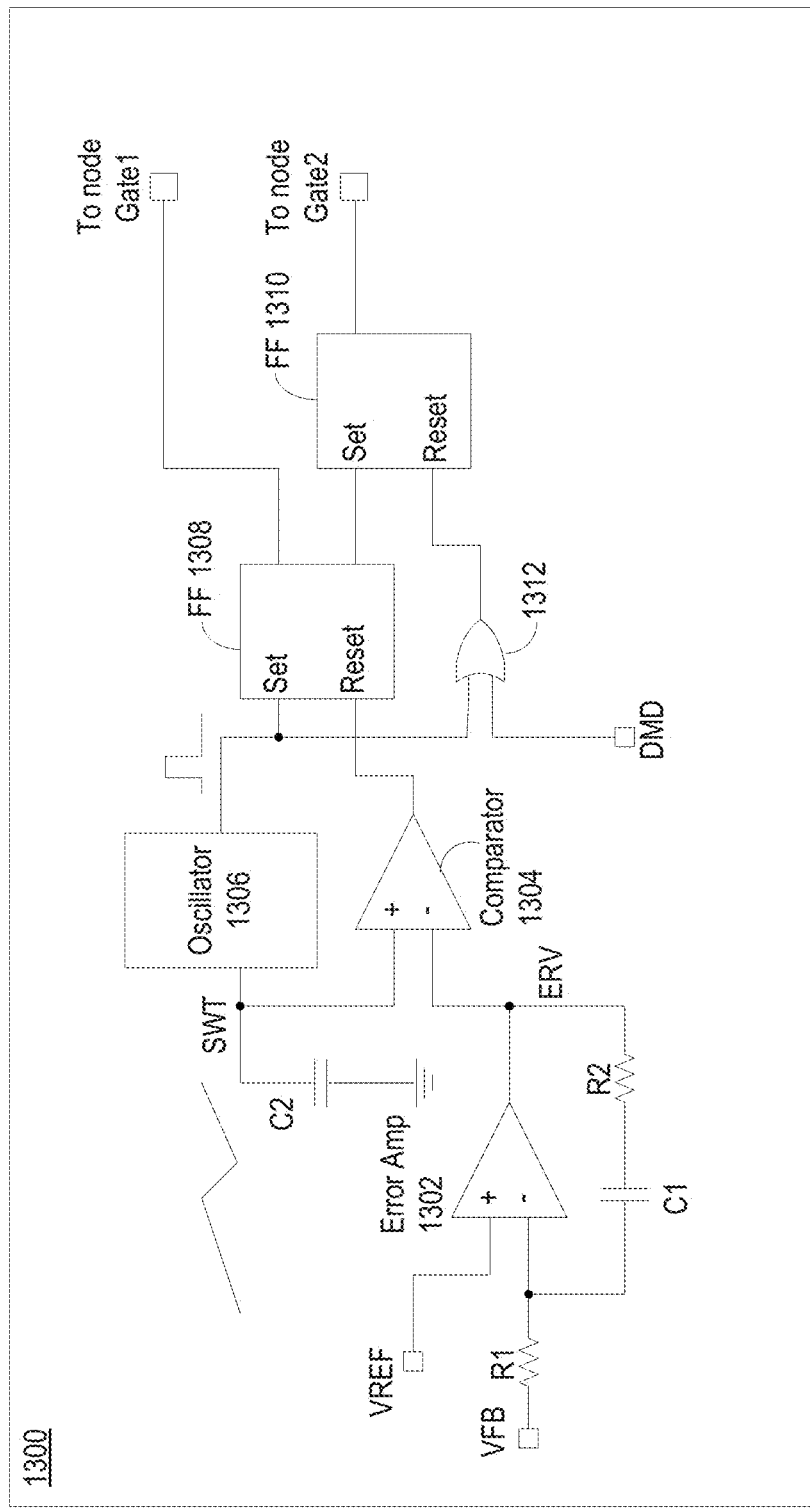
FIG. 13 illustrates a circuit schematic of an exemplary PWM controller, consistent with embodiments of the present disclosure.

FIG. 13 illustrates an exemplary circuit 1300, which can be used to implement PWM Controller 308 of FIGS. 3 and 6, consistent with embodiments of the present disclosure. Circuit 1300 includes an Error Amplifier 1302, a Comparator 1304, an Oscillator 1306 configured to generate a ramp signal as well as a digital output, flip-flops (FF) 1308 and 1310, and an OR gate 1312. In some embodiments, oscillator 1306 is configured to generate the main switching frequency of the converter and to stars the charging cycle by setting FF 1308 at the beginning of each clock cycle. Error Amplifier 1302 is configured to monitor an output voltage (e.g., at node VOUT of circuit 300), or a portion of the output voltage, as a feedback voltage (VFB). Error Amplifier 1302 can compare it with a reference voltage (VREF) to generate a feedback control signal (ERV) to control the duty cycle of the control signals to switches 104 and 106. Comparator 1304 is configured to compare the feedback control signal (ERV) with the ramp voltage from the oscillator, and generate a digital pulse signal to terminate the charging cycle (i.e., when switch 104 is turned on) of the converter by resetting FF 1308. On the other hand, FF 1310 can be set to being the discharge phase (when switch 106 is turned on). The Discharge phase is terminated by resetting FF 1310, which can happen at either the end of the clock cycle, or when the signal from the DMD becomes asserted (e.g., after determining that the inductor current has reached zero). The Error Amplifier can adjust the ERV voltage to adjust the pulse widths of the control signals to switches 104 and 106, to maintain the output voltage at a predetermined level.

As discussed before, a converter can include a switch across the inductor (e.g., switch 310 of circuit 300) to reduce ringing. The switch can be turned on when switch 106 is turned off, and is turned off when switch 104 is turned on. The turning on of the switch can be delayed slightly to allow sufficient time for the detection of the voltage swing at the switching node LX after switch 106 is turned off, and the turning on can be performed by circuit 1300 based on the outputs of FF 1308 and FF 1310.

Figure 14:
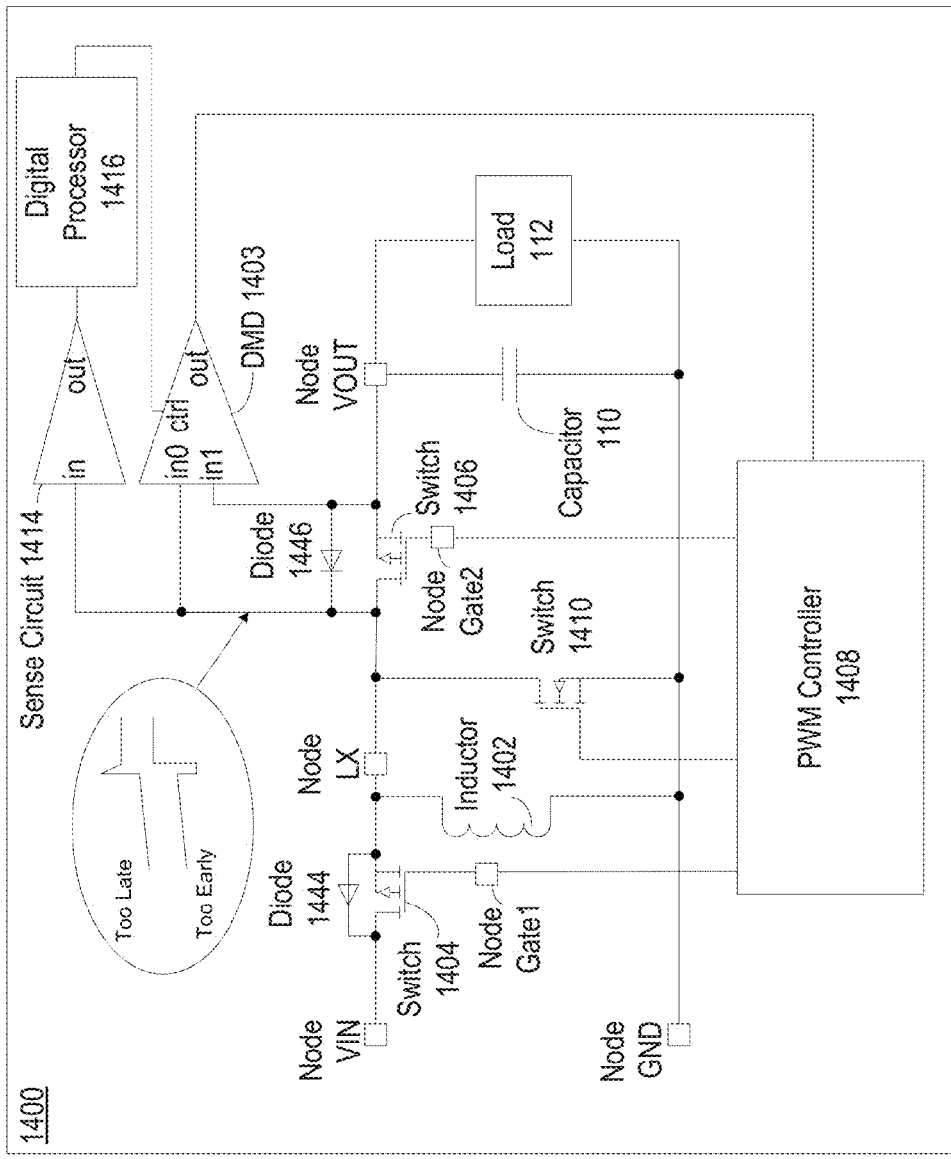
FIG. 14 illustrates a circuit schematic of an exemplary buck-boost converter, consistent with embodiments of the present disclosure.

The embodiments described here can also be applied to a buck-boost type architecture, as illustrated in FIG. 14. FIG. 14 illustrates a circuit 1400, which includes capacitor 110, load 112, inductor 1402, switches 1404 and 1406, PWM Controller 1408, DMD 1403, sense circuit 1414, and digital processor 1416. As shown in circuit 1400 of FIG. 14, inductor 1402 is connected between node LX and GND. Switch 1404 is connected between node LX and node VIN, and is configured to charge the inductor 1402. Switch 1406 is connected between node LX and output capacitor 110, which is also connected to the negative output node (node VOUT) of the converter. Switch 1410 redirects the stored energy in the inductor to charge the output node. Consistent with embodiments disclosed therein, the turning on/off of switches 1404 and 1406 is controlled by PWM controller 1408, which in turn is controlled by DMD 1403. The operation of DMD 1403 can be controlled by digital processor 1416 and sense circuit 1414 based on sampled voltages at node LX that indicate whether the turning-off of switch 1406 is too late or too early compared with a certain threshold (e.g., compared with the time when the inductor current is substantially zero). In some embodiments, sense circuit 1414 is configured to compare the voltage at node LX with GND potential to detect the early or late turning-off of switch 1406. In some embodiments, circuit 1400 includes a switch 1410 across inductor 1402 to mitigate ringing.

Figure 15:
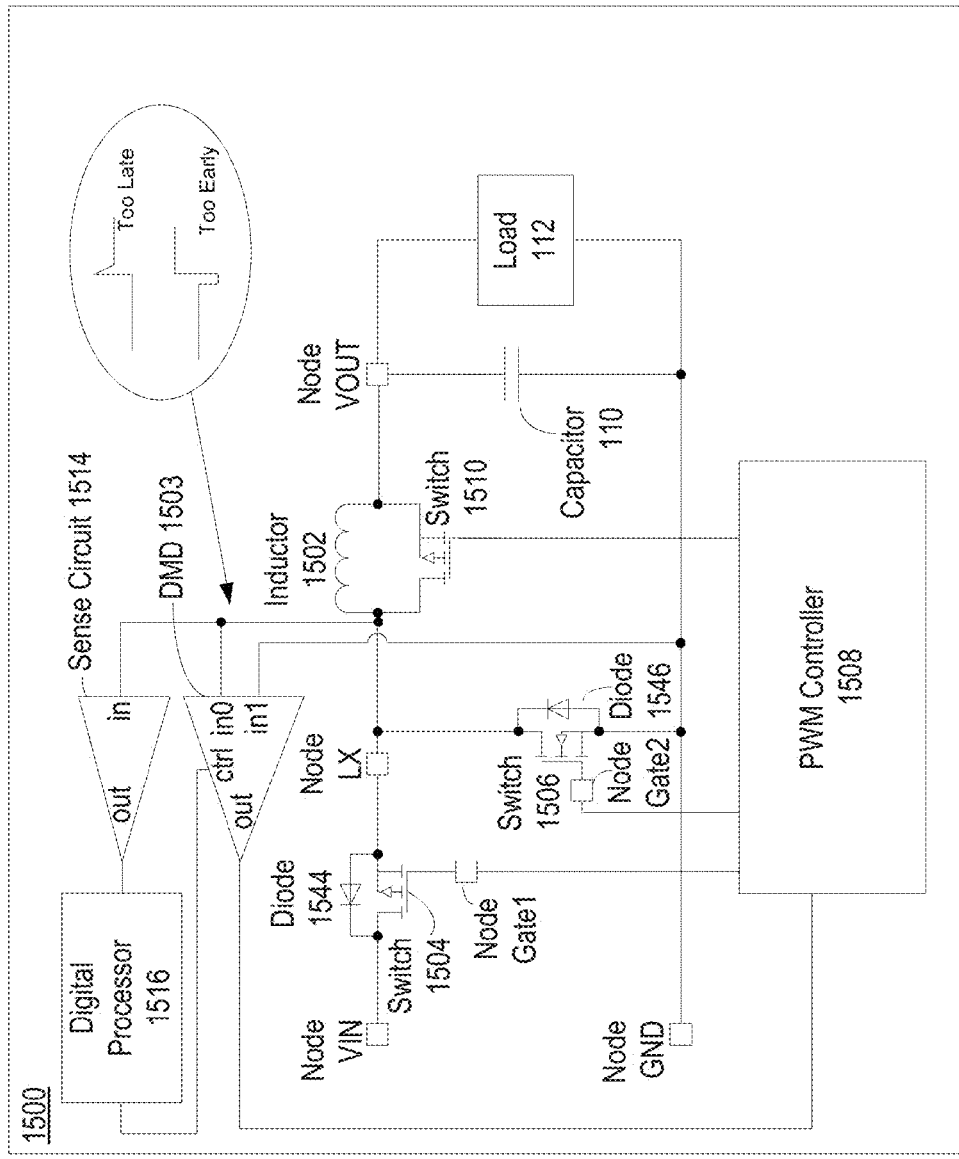
FIG. 15 illustrates a circuit schematic of an exemplary buck converter, consistent with embodiments of the present disclosure.

The embodiments described here can also be applied to a buck-type architecture, as illustrated in FIG. 15. FIG. 15 illustrates a circuit 1500, which includes capacitor 110, load 112, inductor 1502, switches 1504 and 1506, PWM Controller 1508, DMD 1503, sense circuit 1514, and digital processor 1516. As shown in circuit 1500 of FIG. 15, inductor 1502 is connected between the switching node LX and the output capacitor 110, which is also connected to the output node (node VOUT) of the converter. Switch 1504 is connected between node LX and node VIN and is used to charge the inductor. Switch 1506 is connected between node LX and GND. Switch 1506 allows the stored energy in the inductor to continue to flow into the output node. Consistent with embodiments disclosed therein, the turning on/off of switches 1504 and 1506 is controlled by PWM controller 1508, which in turn is controlled by DMD 1503. The operation of DMD 1503 can be controlled by digital processor 1516 and sense circuit 1514 based on sampled voltages at node LX that indicate whether the turning-off of switch 1506 is too late or too early compared with a certain threshold (e.g., compared with the time when the inductor current is substantially zero). In some embodiments, sense circuit 1514 is configured to compare the voltage at node LX with the voltage at VOUT to detect the early or late turning-off of switch 1506. In some embodiments, circuit 1500 includes a switch 1510 across inductor 1502 to mitigate ringing.

Figure 16:
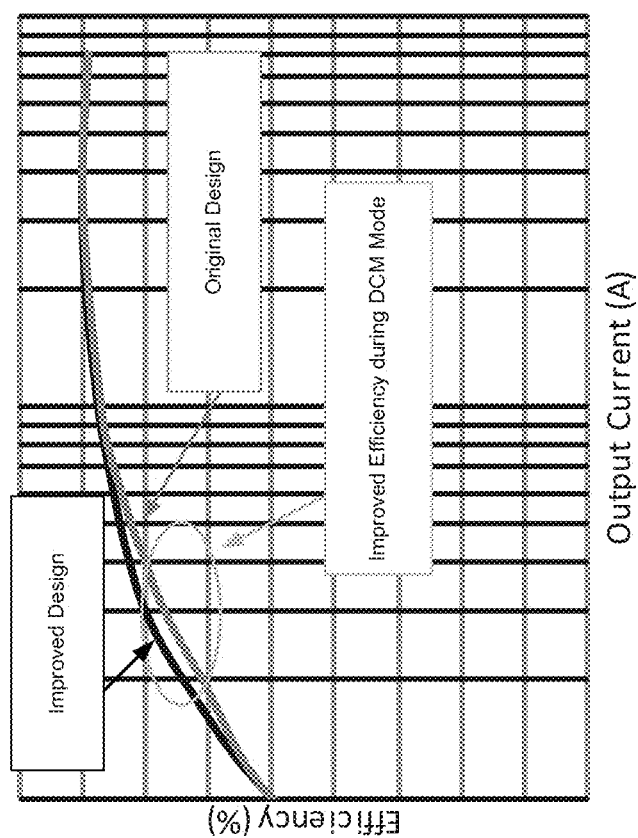
FIG. 16 illustrates a comparison of efficiency curves across operating regions between prior art and embodiments of the present disclosure.

FIG. 16 shows an example efficiency curve for a standard and improved boost converter of this invention. Efficiency is a measure of the output power divided by the input power plotted against the output current into the load. The DCM operation area where the invention provides potential efficiency improvements is indicated in the figure.

With embodiments of the present disclosure, the timing of turning off the discharging switch (e.g., switch 106 of FIGS. 1 and 3, switch 1406 of FIG. 14, switch 1506 of FIG. 15, etc.) can be determined automatically using a feedback loop, where the timing can be evaluated and adjusted based on the EARLY/LATE signals collected at the switching node LX, which provides a measurement of the effectiveness of the adjustment. The feedback loop also enables the determination of the timing to be self-correcting over time, different load conditions, different operating conditions, temperature and other parametric changes of the circuit. As a result, the system can become more robust. Device mismatches and variation in the circuit components, such as the offset and propagation delay of DMD, becomes much less critical to the overall efficiency of the converter in DCM operation, which allows simpler and smaller circuit topologies to be adopted for these circuit components, and power consumption can be reduced.

Moreover, with embodiments of the present disclosure, the voltage swing at the end of the DCM cycle is used to reflect the magnitude and direction of the residual current in the inductor. Such an arrangement allows accurate measurement of the current, and the implementation can be relatively simple.

In the preceding specification, the subject matter has been described with reference to specific exemplary embodiments. It will, however, be evident that various modifications and changes may be made without departing from the broader spirit and scope of the subject matter as set forth in the claims that follow. The specification and drawings are accordingly to be regarded as illustrative rather than restrictive. Other embodiments may be apparent to those skilled in the art from consideration of the specification and practice of the embodiments disclosed herein.

Reference throughout this specification to "an embodiment," "some embodiments," "one embodiment", "another example," "an example," "a specific examples," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example, "in an example," "in a specific examples," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A switch-mode DC converter configured to generate a converted voltage from an input voltage, comprising:
   an inductor configured to store energy;
   a switch coupled with the inductor at a switching node, wherein the switch is configurable to be turned on or off to control the discharging of the energy stored at the inductor to an output node of the converter, wherein the output node is configured to provide the converted voltage; and
   a circuit configured to control a timing of turning-off of the switch based on a voltage difference across the switch, wherein a measurement of the voltage difference is adjusted based on a voltage at the switching node.

2. The switch-mode DC converter of claim 1, wherein the circuit comprises a first comparator configured to measure the voltage difference; and wherein the timing of turning-off of the switch is controlled based on an output voltage of the first comparator.

3. The switch-mode DC converter of claim 2, wherein the first comparator further includes an offset adjustment block configured to introduce an offset in the first comparator, wherein the offset is adjusted based on the voltage at the switching node.

4. The switch-mode DC converter of claim 3, wherein the first comparator includes a first transistor coupled with a first current source at a first node and a second transistor coupled with a second current source at a second node; wherein the first transistor is coupled with a first terminal of the switch and the second transistor is coupled with a second terminal of the switch; and wherein the comparison between the voltage at the switching node and the converted voltage is based on a voltage difference between the first node and the second node.

5. The switch-mode DC converter of claim 4, wherein the offset is introduced by injecting an offset current at one of the first and second nodes.

6. The switch-mode DC converter of claim 3, wherein the circuit further includes one or more second comparators configured to compare between the voltage at the switching node and one or more threshold voltages; and wherein the offset is adjusted based on one or more output voltages of the one or more second comparators.

7. The switch-mode DC converter of claim 6, wherein the one or more threshold voltages are generated based on the input voltage.

8. The switch-mode DC converter of claim 6, wherein the one or more threshold voltages are generated based on the converted voltage.

9. The switch-mode DC converter of claim 6, wherein the one or more threshold voltages are generated from a ground potential.

10. The switch-mode DC converter of claim 6, wherein the circuit includes two second comparators configured to compare the voltage at the switching node against two threshold voltages and to generate a first output voltage and a second output voltage; wherein the offset is increased when the first output voltage exceeds a first predetermined value; and wherein the offset is reduced when the second output voltage exceeds a second predetermined value.

11. The switch-mode DC converter of claim 6, wherein the circuit includes a second comparator and a multiplexer; wherein the multiplexer is configured to select a threshold voltage from a set of threshold voltages; wherein the second comparator is configured to compare the voltage at the switching node against the selected threshold voltage.

12. The switch-mode DC converter of claim 6, further comprising a counter and one or more samplers; wherein the one or more samplers are configured to sample the one or more output voltages of the one or more second comparators; and wherein the counter is configured to store a value and to update or maintain the stored value based on one or more outputs of the one or more samplers; and wherein the offset is adjusted based on the stored value.

13. The switch-mode DC converter of claim 12, wherein the one or more samplers include a latch; and wherein the latch is timed based on a control signal configured to turn on or off the switch.

14. The switch-mode DC converter of claim 12, further comprising one or more digital filters configured to filter the one or more outputs of the one or more samplers; wherein the counter is configured to update the stored value based on one or more outputs of the one or more digital filters.

15. The switch-mode DC converter of claim 12, wherein the stored value is updated based on a target value.

16. The switch-mode DC converter of claim 2, wherein the first comparator is turned off during a time when the inductor is being charged.

17. The switch-mode DC converter of claim 1, wherein the circuit is further configured to measure the voltage difference across the switch and to sample the voltage at the switching node periodically; wherein a period of the measurement and the adjustment is determined based on a plurality of samples of the voltage at the switching node.

* * * * *